United States Patent
Jung et al.

(10) Patent No.: US 10,034,385 B2
(45) Date of Patent: Jul. 24, 2018

(54) METHOD OF PREPARING METAL PATTERN HAVING 3D STRUCTURE

(71) Applicant: LG CHEM, LTD., Seoul (KR)

(72) Inventors: Jin Mi Jung, Daejeon (KR); Jae Jin Kim, Daejeon (KR); Jeong Ho Park, Daejeon (KR); Bu Gon Shin, Daejeon (KR)

(73) Assignee: LG CHEM, LTD., Seoul (KR)

( * ) Notice: Subject to any disclaimer, the term of this patent is extended or adjusted under 35 U.S.C. 154(b) by 50 days.

(21) Appl. No.: 14/441,067

(22) PCT Filed: Aug. 1, 2014

(86) PCT No.: PCT/KR2014/007137
§ 371 (c)(1),
(2) Date: May 6, 2015

(87) PCT Pub. No.: WO2015/016678
PCT Pub. Date: Feb. 5, 2015

(65) Prior Publication Data
US 2015/0289378 A1    Oct. 8, 2015

(30) Foreign Application Priority Data

Aug. 1, 2013  (KR) ........................ 10-2013-0091794
Aug. 1, 2014  (KR) ........................ 10-2014-0099027

(51) Int. Cl.
*B05D 3/00* (2006.01)
*C08J 7/18* (2006.01)
(Continued)

(52) U.S. Cl.
CPC .............. *H05K 3/10* (2013.01); *B32B 15/04* (2013.01); *H05K 1/0283* (2013.01); *H05K 3/20* (2013.01);
(Continued)

(58) Field of Classification Search
CPC ........... H05K 3/10; H05K 3/20; B41M 7/009; B41M 7/0081; B41M 5/52; B41M 5/265; B41M 5/323
See application file for complete search history.

(56) References Cited

U.S. PATENT DOCUMENTS 6,770,337 B2 *  8/2004  Debe .................. B41M 5/38207
                                                     156/235
7,528,448 B2    5/2009  Bailey et al.
(Continued)

FOREIGN PATENT DOCUMENTS

CN    101835624 A    9/2010
CN    103182878 A    7/2013
(Continued)

OTHER PUBLICATIONS

Database, WPI, Week 201235; Thomson Scientific, London, GB; AN 2012-F68033 XP-002766337, citing Application# JP20100240512 (Hakii), published as previously made of record on May 6, 2015.

*Primary Examiner* — Michael P Wieczorek
(74) *Attorney, Agent, or Firm* — Dentons US LLP

(57) ABSTRACT

The present application relates to a method of preparing a metal pattern having a 3D structure, a metal pattern laminate, and use of the metal pattern laminate. According to the method of preparing a metal pattern, the metal pattern having a 3D structure can be effectively formed on a receptor. Especially, the metal pattern having a 3D structure can also be effectively and rapidly transferred to a surface of the receptor, such as, a flexible substrate, to which the metal pattern is not easily transferred. The metal pattern laminate prepared using the method can, for example, be usefully used for metal layers of flexible electronic devices or metal interconnection lines.

13 Claims, 3 Drawing Sheets

(51) Int. Cl.
*G21H 5/00* (2006.01)
*H05K 3/10* (2006.01)
*H05K 1/02* (2006.01)
*H05K 3/20* (2006.01)
*B32B 15/04* (2006.01)
*H01L 51/00* (2006.01)
*H01L 51/44* (2006.01)
*H01L 51/52* (2006.01)

(52) U.S. Cl.
CPC ......... *B32B 2457/12* (2013.01); *H01L 51/003* (2013.01); *H01L 51/0021* (2013.01); *H01L 51/441* (2013.01); *H01L 51/5203* (2013.01); *H05K 1/028* (2013.01); *H05K 2201/0382* (2013.01); *H05K 2203/107* (2013.01); *H05K 2203/1105* (2013.01)

(56) References Cited

U.S. PATENT DOCUMENTS

| | | | |
|---|---|---|---|
| 7,670,450 B2 * | 3/2010 | Lamansky | B41M 5/52 156/235 |
| 8,123,891 B2 * | 2/2012 | Dolsey | B41M 5/0256 156/240 |
| 2005/0123801 A1 * | 6/2005 | Yang | H01L 51/0013 428/690 |
| 2009/0035493 A1 * | 2/2009 | Murakami | B41J 2/325 428/32.77 |
| 2011/0097550 A1 * | 4/2011 | Matusovsky | B23K 26/0066 428/167 |

FOREIGN PATENT DOCUMENTS

| | | |
|---|---|---|
| JP | 2003-077651 A | 3/2003 |
| JP | 2009-544169 A | 12/2009 |
| JP | 2009-545853 A | 12/2009 |
| JP | 2010-533977 A | 10/2010 |
| JP | 2012-92388 A | 5/2012 |
| JP | 2013-140800 A | 7/2013 |
| KR | 10-2006-0007503 A | 1/2006 |
| KR | 10-0643684 B1 | 11/2006 |
| KR | 10-2009-0034364 A | 4/2009 |
| KR | 10-2010-0087018 A | 8/2010 |
| KR | 10-2011-0138448 A | 12/2011 |
| KR | 10-2013-0078600 A | 7/2013 |
| WO | WO 2009/055515 A1 | 4/2009 |
| WO | 2011/065292 A1 | 6/2011 |

* cited by examiner

[Figure 1]
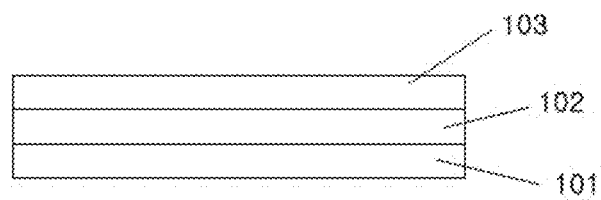
[Figure 2]
[Figure 3]
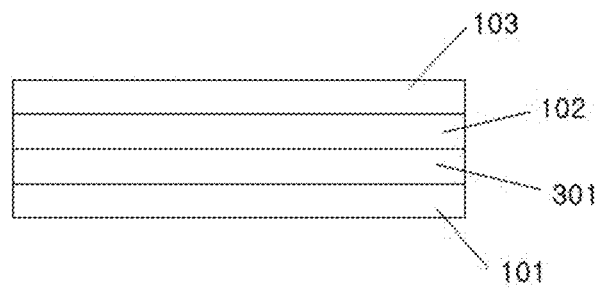

[Figure 4]
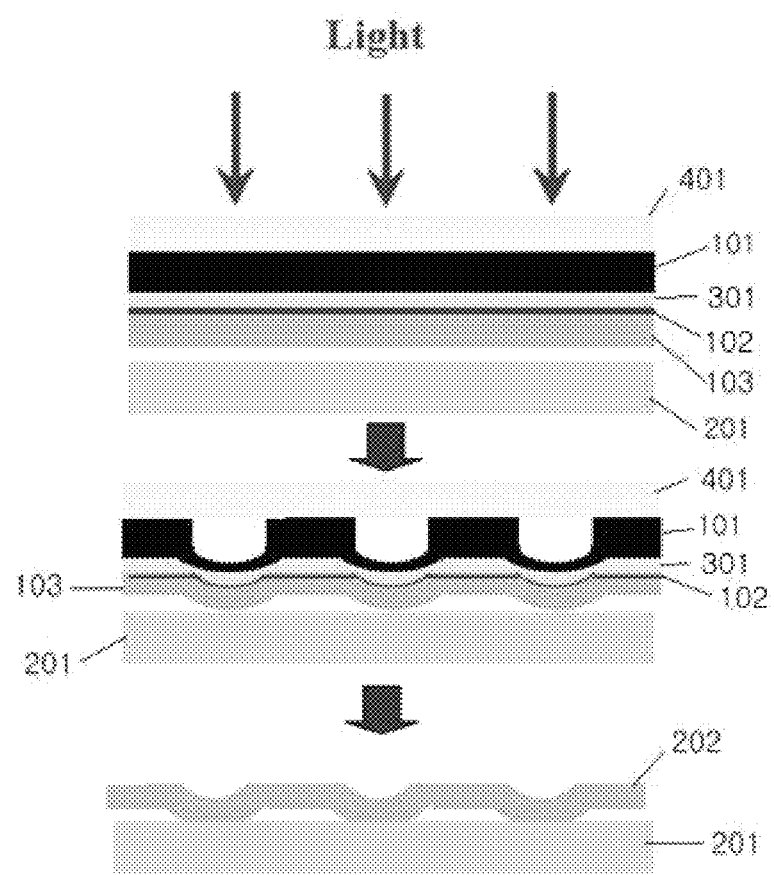
[Figure 5]
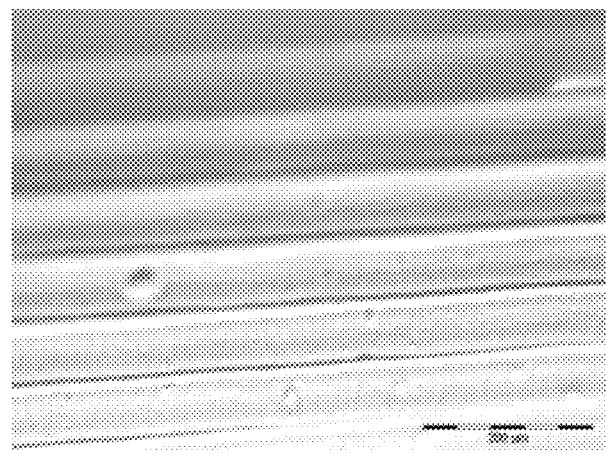

[Figure 6]
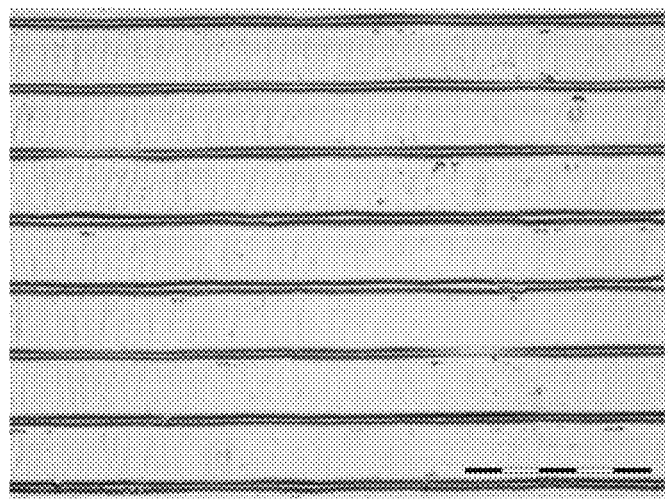
[Figure 7]
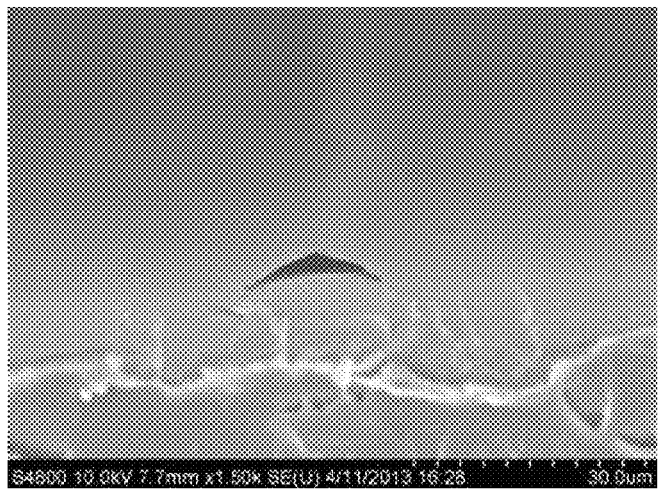

METHOD OF PREPARING METAL PATTERN HAVING 3D STRUCTURE

This application is a National Stage Entry of International Application No. PCT/KR2014/007137, filed on Aug. 1, 2014, and claims the benefit of Korean Application No. 10-2013-0091794, filed on Aug. 1, 2013, and Korean Application No. 10-2014-0099027, filed on Aug. 1, 2014, all of which are hereby incorporated by reference in their entirety

TECHNICAL FIELD

The present application relates to a method of preparing a metal pattern having a three-dimensional (3D) structure, a metal pattern laminate, and use of the metal pattern laminate.

BACKGROUND ART

Metal patterns may be efficiently used for various applications. For example, the metal patterns may be used to design logos and cards, or form electrodes or single-faced antennas for various types of electronic equipment. For example, the metal pattern may be used as an electrode layer of an electronic device (Patent Document 1: Japanese Patent Laid-open Publication No. 2012-092388).

In recent years, there is an increasing demand for technology of replacing a substrate for electronic devices from a hard glass-based substrate to a flexible polymer-based substrate with increasing attention to flexible electronic devices. In this regard, a method of transferring various metal patterns has been used as a method of forming a metal electrode on a substrate. However, such a method has a problem in that a flexible substrate shows poorer durability to heat and a solvent than a hard substrate, which makes it difficult to form an electrode layer having a metal pattern. Also, technology of forming a metal pattern having a 3D shape, which is durable against bending and stretching, is required to manufacture a flexible electronic device. However, such technology has a restriction of intactly transferring the 3D structure of a metal layer to a substrate while maintaining the 3D shape of the metal layer.

DISCLOSURE

Technical Problem

The present application is directed to providing a method of preparing a metal pattern having a three-dimensional (3D) structure, a metal pattern laminate, and use of the metal pattern laminate.

Technical Solution

A method of preparing a metal pattern having a 3D structure according to one exemplary embodiment of the present application may include disposing a metal layer of a film for transferring a metal pattern on a receptor to face the receptor, and irradiating the photothermal conversion layer with light. Here, the film sequentially includes a photothermal conversion layer, an intermediate layer, and the metal layer. In the present application, the metal pattern having a 3D structure may refer to a continuous metal layer in which the transferred metal pattern has an uneven structure. A portion of the metal layer may be used as a concept for discriminating from the metal pattern transferred to the receptor.

As described above, the film for transferring a metal pattern may sequentially include the photothermal conversion layer, the intermediate layer, and the metal layer. FIG. 1 is a diagram exemplarily showing a film for transferring a metal pattern in which a photothermal conversion layer 101, an intermediate layer 102, and a metal layer 103 are sequentially formed. For example, when such a film for transferring a metal pattern is used, a continuous metal layer having a metal pattern 202 having a 3D structure, that is, an uneven structure, may be effectively formed on a receptor 201, as shown in FIG. 2.

In the present application, the photothermal conversion layer may, for example, refer to a functional layer that can absorb irradiated light, for example, light in an infrared-visible ray region and convert a portion of the absorbed light into heat. The photothermal conversion layer may be selected and used without particular limitation as long as it includes a material (hereinafter referred to as a light absorbing material) that can absorb light in an infrared-visible ray region and convert a portion of the absorbed light into heat. The light absorbing materials are widely known in the related art. Such materials may be applied to the photothermal conversion layer without particular limitation.

For example, a dye may be used as the light absorbing material. For example, dyes capable of absorbing light in an infrared ray region are widely known in the related art. For example, dyes disclosed in Matsuoka, M., Infrared Absorbing Materials, Plenum Press, New York, 1990 and Matsuoka, M., Absorption Spectra of Dyes for Diode Lasers, Bunshin Publishing Co., Tokyo, 1990, U.S. Pat. Nos. 4,772,583, 4,833,124, 4,912,141, 4,948,776, 4,948,777, 4,948,778, 4,950,639, 4,940,640, 4,952,552, 5,023,229, 5,024,990, 5,286,604, 5,340,699, and 5,401,607, or European Patent Application Nos. 321,923 and 568,993 may be used. Also, dyes disclosed in Bello, K. A. et al., J. Chem. Soc., Chem. Commun, 452 (1993), and U.S. Pat. No. 5,360,694 may also be used. By way of another example, IR absorbents sold as the trademarks IR-99, IR-126, and IR-165 by American Cyanamid or Glendale Protective Technologies may also be used. For example, IR-absorbing conductive polymers such as light absorbing materials disclosed in U.S. Pat. No. 5,351,617 may, for example, be used in addition to the dyes.

Other examples of the light absorbing material that may be used herein may include carbon black, a metal, a metal oxide, or a metal sulfide. For example, examples of the light absorbing material that may be used herein may include metal elements or alloys thereof of Groups Ib, IIb, IIIa, IVa, IVb, Va, Vb, VIa, VIb, and VIII in the periodic table of elements, elements and alloys of Groups Ia, IIa, or IIIb, or and mixtures thereof. For example, Al, Bi, Sn, In, or Zn, or an alloy thereof, elements or alloys thereof of Groups Ia, IIa, and IIIb in the periodic table of elements, or compounds or mixtures thereof are known in the related art. The suitable compound that may be used herein may include sulfides of Al, Bi, Sn, In, Zn, Ti, Cr, Mo, W, Co, Ir, Ni, Pd, Pt, Cu, Ag, Au, Zr, and Te, or mixtures thereof.

The photothermal conversion layer may include only the above-described material, or may include the material with a proper binder, when necessary. For example, the photothermal conversion layer may be formed using a binder in which the above-described material such as carbon black is dispersed. Types of binders that may be used herein are not particularly limited, and a known resin composition may be used as the binder. For example, a phenolic resin (for example, novolac, resol resin, etc.), and a thermal curing agent, a thermal curable polymer, or a thermoplastic polymer, such as polyvinyl acetate, polyvinylidene chloride, polyacrylate, cellulose ether or ester, nitrocellulose, polycarbonate, and mixtures thereof may be used as the binder.

The thickness of the photothermal conversion layer is not particularly limited, and may be properly chosen without causing damage to desired physical properties. For example, the photothermal conversion layer may have a thickness of approximately 0.1 µm to 2.0 µm. When the thickness of the photothermal conversion layer is less than this thickness range, a quantity of energy at which light is converted into heat may be reduced due to a low energy absorption rate, resulting in a decrease in swelling pressure. On the other hand, when the thickness of the photothermal conversion layer exceeds this thickness range, a poor edge opening may occur due to a stepped portion appearing between the film for transferring a metal pattern and the receptor substrate having the metal pattern formed therein.

In the present application, the intermediate layer may, for example, refer to a functional layer having a suitable surface energy to adjust a peel strength of the metal layer when the metal layer is transferred to the receptor upon irradiation with light. For example, the intermediate layer may be formed to have a surface energy of approximately 25 mN/m or less, 24 mN/m or less, 23 mN/m or less, 22 mN/m or less, 21 mN/m or less, 20 mN/m or less, 19 mN/m or less, 18 mN/m or less, 17 mN/m or less, 16 mN/m or less, or 15 mN/m or less. Such surface energy may, for example, be a value obtained by determining a surface energy of a solid from contact angles between $H_2O$ and $CH_2I_2$, as obtained using a contact angle measuring apparatus. When the surface energy of the intermediate layer on which the metal layer is formed satisfies this surface energy range, the metal pattern having a 3D structure may be effectively transferred from the metal layer of the film for transferring a metal pattern to the receptor.

For example, the intermediate layer may be formed using a fluorine-based or silicon-based compound. Such a compound may be directly used to form the intermediate layer as an organic monomolecular film, or a fluorine-based or silicon-based resin may be blended with a suitable binder to form the intermediate layer in the form of a polymer film. The organic monomolecular material may, for example, be selected from materials having a functional group, such as a methyl group, a linear or branched alkyl group, a fluorinated alkyl group or an aryl group, in a basic structure of a silane, and used. In the case of the fluorine-based or silicon-based resin, for example, a substituent including fluorine may be engrafted into the backbone of a photocurable resin such as urethane acrylate, epoxy acrylate, or polyester acrylate, and the substituent-grafted photocurable resin may be used to form an intermediate layer, or a binder in which a reactive or non-reactive fluorine-based or silicon-based additive is blended in the form of an additive may be used to form an intermediate layer. For example, a fluorine-based compound containing a vinyl group, or a non-reactive fluorine-based compound may be used as the fluorine-based additive, and polyether-modified polydimethylsiloxane, a polyether-modified dimethylpolysiloxane copolymer, dimethylpolysiloxane-, modified dimethylpolysiloxane-, and methylalkyl-siloxane-based silicon acrylates, and a silicon acrylate showing reactivity may, for example, be used as the silicon-based additive. For example, materials known as the trade names BYK-300, BYK-301, BYK-302, and the like commercially available from BYK may also be used herein.

The thickness of the intermediate layer is not particularly limited, and may be properly chosen without causing damage to desired physical properties. For example, when the intermediate layer is formed of the fluorine- or silicon-based polymer film, the intermediate layer may have a thickness of approximately 0.5 µm to approximately 3 µm. Also, when the intermediate layer is for example formed of the fluorine- or silicon-based organic monomolecular film, the intermediate layer may have a thickness of approximately 5 nm to 100 nm.

Materials used to form the metal layer are not particularly limited, and may be properly selected in consideration of a purpose of applying the film for transferring a metal pattern. According to one exemplary embodiment, the materials used to form the metal layer may be determined in relation with materials used to form the photothermal conversion layer. For example, the material of the metal layer may be a material having a lower boiling point than the melting point of the material used to form the photothermal conversion layer. Examples of the material capable of forming the metal layer may include metals such as aluminum, copper, silver, gold, iron, platinum, tungsten, chromium, or alloys thereof, but the present application is not limited thereto.

The thickness of the metal layer is not particularly limited, and may be properly chosen according to a desired purpose, or the shape of the metal pattern to be transferred. The metal layer may, for example, have a thickness of approximately 50 nm to approximately 1 µm.

Also, the film for transferring a metal pattern may further include a proper supporting substrate. In this case, the above-described photothermal conversion layer may be formed on the supporting substrate. All known substrates through which light to be radiated to the photothermal conversion layer, for example, light in an infrared ray region, may transmit and which can serve as a supporting member may be used as the supporting substrate. For example, a glass substrate such as a non-alkaline glass substrate, a quartz substrate, or a transparent resin substrate may be used as the supporting substrate. A known plastic film such as a polyimide (PI) film, a polyethylene naphthalate (PEN) film, a polycarbonate (PC) film, an acrylic film, a poly(ethylene terephthalate) (PET) film, a poly(ether sulfide) (PES) film, or a polysulfone (PS) film may, for example, be used as the transparent resin substrate. In this case, specific examples of the transparent resin substrate are not particularly limited.

The film for transferring a metal pattern may further include a blocking layer. In this case, the blocking layer may be present between the photothermal conversion layer and the intermediate layer. In the present application, the blocking layer may, for example, refer to a functional layer that can prevent the metal layer from being transferred together with the material of the photothermal conversion layer when the metal layer is transferred to the receptor in a transfer process. FIG. 3 is a diagram exemplarily showing the film for transferring a metal pattern, which sequentially includes a photothermal conversion layer 101, a blocking layer 301, an intermediate layer 102, and a metal layer 104.

For example, the blocking layer may be selected and used without particular limitation as long as it includes a material that can prevent the metal layer from being transferred together with the material of the photothermal conversion layer when the metal layer is transferred to the receptor in a transfer process. Therefore, the blocking layer may reduce or prevent a level of contamination or distortion which may be caused during a transfer process. Also, the blocking layer may prevent the metal layer from being burned by heat generated in the photothermal conversion layer when the heat is transferred to the metal layer.

The blocking layer may be formed using an organic and/or inorganic binder material(s). For example, the blocking layer may be formed using a material which exhibits high thermal resistance and hardly reacts with the photothermal conversion layer in a transfer process. Examples of the organic binder material that may be used herein include all types of thermosetting materials or thermoplastic materials. Examples of a suitable material of the blocking layer may include an acrylic, urethane-based, ester-based, or epoxy-based organic binder. For example, the materials may be coated onto the photothermal conversion layer as a thermoplastic precursor material, and then may be cross-linked. A proper thermal plasticizer may include a polysulfone, a polyester, or a polyimide. In this case, the thermal plasticizer may be coated onto the photothermal conversion layer using a conventional coating method.

The thickness of the blocking layer is not particularly limited, and may be properly chosen without causing damage to desired physical properties. For example, the blocking layer may have a thickness of approximately 0.05 μm to approximately 3 μm.

The metal pattern having a 3D structure may be transferred from the metal layer of the film for transferring a metal pattern so that the metal pattern is formed on the receptor. As described above, the metal pattern having a 3D structure may be prepared by a process of disposing the metal layer of the film for transferring a metal pattern on the receptor to face the receptor, and irradiating the photothermal conversion layer with light.

For example, the metal pattern having a 3D structure may be formed as light energy of light is converted into heat energy at the photothermal conversion layer irradiated with light, the volume expansion of the photothermal conversion layer occurs due to the heat energy, and the material of the metal layer is influenced by the volume expansion to transfer the metal layer to the receptor.

Types of light radiated in the process, and a method of radiating light are not particularly limited. For example, light in a proper wavelength region may be radiated using a known light source in consideration of types of photothermal conversion materials used. In this procedure, only a predetermined portion of the photothermal conversion layer may be selectively irradiated with light. For example, the photothermal conversion layer may be irradiated by determining a desired location, an entire irradiation area, and a scan type using a scanner, or may be selectively irradiated by an irradiation method using a mask. Irradiating the photothermal conversion layer with light may, for example, be performed using a laser in a continuous wave (CW) mode. When the laser in a CW mode is radiated, for example, it is more desirable to form the above-described metal pattern having a 3D structure.

Types of the receptor having the metal pattern formed therein are not particularly limited, and may be properly selected according to a desired purpose. For example, the receptor may be an inorganic substrate such as a glass substrate or a quartz substrate, or a known plastic substrate such as a PI substrate, a PEN substrate, a PC substrate, an acrylic substrate, a PET substrate, a PES substrate, or a PS substrate. According to one exemplary embodiment, the receptor may be a flexible substrate exhibiting flexibility. When the film is applied to the above-described flexible substrate, the metal pattern having a 3D structure, which is durable against bending and stretching, may be effectively formed on the flexible substrate.

As described above, the metal pattern transferred onto the receptor may have a 3D structure. That is, the metal layer having an uneven structure may be transferred to the receptor in a transfer process. In this case, the transferred metal layer may be a continuous metal layer having an uneven structure.

FIG. 4 is a diagram schematically showing that a continuous metal pattern 202 is transferred to the receptor 201 in the transfer process, that is, a diagram exemplarily showing a transfer process using a film in which the photothermal conversion layer 101, the blocking layer 301, the intermediate layer 102, and the metal layer 103 are sequentially formed on a supporting substrate 401. As shown in FIG. 4, the continuous metal pattern 202 having an uneven structure may be formed on the receptor 201 when the film for transferring a metal pattern in which the material of the photothermal conversion layer and/or the physical properties (boiling point, etc.) of the metal layer are controlled is selectively irradiated with properly selected light at a proper location.

Also, the present application is directed to providing a metal pattern laminate. The metal pattern laminate according to one exemplary embodiment may include a flexible substrate, and a continuous metal layer having an uneven structure formed on the flexible substrate. Such a laminate may, for example, be formed using the above-described method of preparing a metal pattern having a 3D structure. Therefore, the contents described above in the method may be equally applied for the flexible substrate and the metal layer of the metal pattern laminate. The metal pattern laminate according to one exemplary embodiment may be usefully used to manufacture a flexible electronic device since the metal pattern formed on the flexible substrate has a 3D uneven structure, and the metal pattern laminate is highly durable against bending and stretching as well.

Further, the present application is directed to providing use of the metal pattern laminate. For example, the metal pattern laminate may be usefully used for an electrode layer or a metal interconnection line. Also, the electrode layer may be applied to an organic electronic device, and thus may be usefully used to manufacture a flexible electronic device. When the metal pattern laminate is applied to the electrode layer, the metal interconnection line, or the organic electronic device, the other parts constituting the electrode layer, the metal interconnection line, or the organic electronic device, or a method of constituting the electrode layer, the metal interconnection line, or the organic electronic device are not particularly limited. For example, all the materials and methods known in the related art may be adopted as long as the metal pattern laminate can be used herein.

Effects of Invention

According to the method of the present application, the metal pattern having a 3D structure can be effectively formed on a receptor. Especially, according to the method of the present application, the metal pattern having a 3D structure can also be effectively and rapidly transferred to a surface of the receptor, such as, a flexible substrate, to which the metal pattern is not easily transferred. For example, the metal pattern laminate prepared using the method can be usefully used for electrode layers of flexible electronic devices or metal interconnection lines.

BRIEF DESCRIPTION OF DRAWINGS

FIG. 1 is a diagram exemplarily showing a film for transferring a metal pattern.

FIG. 2 is a diagram exemplarily showing a case that a metal layer having a 3D structure is transferred to a receptor.

FIG. 3 is a diagram exemplarily showing a film for transferring a metal pattern.

FIG. 4 is a diagram exemplarily showing a method of preparing a metal pattern having a 3D structure.

FIG. 5 is an image showing a surface of the metal layer of the film for transferring a metal pattern in a transfer process described in Example 1.

FIG. 6 is an image showing a surface of the metal pattern having a 3D structure transferred to the receptor in Example 1.

FIG. 7 is an image showing a lateral surface of the metal pattern having a 3D structure transferred to the receptor in Example 1.

BEST MODE

Hereinafter, the present application will be described in detail with exemplary embodiments of the present application. However, the scope of the present application is not limited by the exemplary embodiments provided below.

Measurement Example 1: Measurement of Surface Energy

The surface energy of a solid was determined from a contact angle formed between water ($H_2O$) and a drop of diiodomethane ($CH_2I_2$) by an Owen-Wendt method using a contact angle analyzer (a drop shape analyzer DSA100, KRUSS GmbH).

Example 1

Preparation of Film for Transferring Metal Pattern

A film for transferring a metal pattern was prepared by sequentially forming a photothermal conversion layer, a blocking layer, an intermediate layer, and a metal layer on a PET film serving as a supporting substrate. The photothermal conversion layer was formed on a supporting substrate to a thickness of 2.5 μm by preparing a composition for preparing a photothermal conversion layer including carbon black, followed by coating the supporting substrate with the composition by means of bar coating, the blocking layer was formed on the photothermal conversion layer to a thickness of 15 μm by preparing a composition for preparing a blocking layer including a thermosetting urethane-based material, followed by coating the photothermal conversion layer with the composition by means of bar coating, the intermediate layer was formed on the blocking layer to a thickness of approximately 20 nm by spin-coating a solution of OPTOOL™ (commercially available from DAIKIN INDUSTRIES, Ltd.) which was one of the fluorine-based organic silicon compounds (the intermediate layer having a surface energy of 23 mN/m), and the metal layer was formed on the intermediate layer to a thickness of approximately 100 nm by sputtering an aluminum metal.

Transfer of Metal Pattern

To carry out a transfer test using a laser, a 50 W fiber laser with a continuous wave (CW) of 1070 nm was used. To radiate a laser beam with uniform power, a square beam with a size of approximately 0.2 mm×0.2 mm was formed on a focal plane by passing a laser through a homogenizer and then through a f-theta lens. A metal layer of the film for transferring a metal pattern was arranged on a receptor substrate (i.e., a PET film) to face the receptor substrate, and the metal pattern was transferred onto the receptor substrate by scanning the supporting substrate of the film with the IR laser at a voltage of 1.6 W and a scanning rate of 0.5 to 0.6 m/s. FIG. 5 is an image showing a surface of the metal layer of the film for transferring a metal pattern in a transfer process described in Example 1. As shown in FIG. 5, it could be seen that the surface of the metal layer had an uneven structure due to an effect on volume expansion of the photothermal conversion layer. Also, FIGS. 6 and 7 are images showing a surface and a lateral surface of the metal pattern having a 3D structure transferred to the receptor in Example 1, respectively. As shown in FIGS. 6 and 7, it could be seen that not only a convex portion of the metal layer in the film for transferring a metal pattern was selectively transferred, but the entire continuous metal layer having an uneven structure was transferred due to the volume expansion of the photothermal conversion layer.

BRIEF DESCRIPTION OF MAIN PARTS IN THE DRAWINGS

101: photothermal conversion layer
102: intermediate layer
103: metal layer
201: receptor
202: metal pattern
301: blocking layer
401: supporting substrate

The invention claimed is:

1. A method of preparing a metal pattern having a three-dimensional (3D) structure, comprising:
   disposing a film to face a receptor, wherein the film is for transferring a metal pattern to the receptor, the film sequentially comprising:
      a photothermal conversion layer;
      an intermediate layer having a surface energy of 25 mN/m or less and comprising a film of organic monomolecular material having a fluorinated alkyl group in a basic structure of a silane; and
      a metal layer, wherein the film is positioned so that the metal layer faces the receptor; and
   transferring an entire continuous metal layer having an uneven structure to the receptor by irradiating the photothermal conversion layer with light of an IR laser in a continuous wave (CW) mode at a scanning rate of 0.5 to 0.6 m/s resulting in a volume expansion of the photothermal conversion layer, wherein the uneven structure is formed due to an effect of the volume expansion of the photothermal conversion layer.

2. The method of claim 1, wherein the receptor is a flexible substrate.

3. The method of claim 1, wherein the photothermal conversion layer comprises a dye, carbon black, a metal, a metal oxide, or a metal sulfide.

4. The method of claim 3, wherein the metal sulfide is sulfides of Al, Bi, Sn, In, Zn, Ti, Cr, Mo, W, Co, Ir, Ni, Pd, Pt, Cu, Ag, Au, Zr or Te.

5. The method of claim 3, wherein the photothermal conversion layer is a resin composition layer comprising a dye, carbon black, a metal, a metal oxide, or a metal sulfide.

6. The method of claim 1, wherein the intermediate layer has a thickness of 5 nm to 100 nm.

7. The method of claim 1, wherein the metal layer comprises aluminum, copper, silver, gold, iron, platinum, tungsten, or alloys thereof.

8. The method of claim 1, wherein the film for transferring the metal pattern further comprises a blocking layer present between the photothermal conversion layer and the intermediate layer.

9. The method of claim 8, wherein the blocking layer comprises a thermoplastic material, or a thermosetting material.

10. The method of claim 8, wherein the blocking layer comprises an acryl-based, urethane-based, ester-based, or epoxy-based organic binder.

11. The method of claim 1, wherein the laser is passed through a homogenizer and a f-theta lens to form a square beam on a focal plane of the photothermal conversion layer.

12. The method of claim 11, wherein the laser is a 50 W fiber laser having a wavelength of 1070 nm.

13. The method of claim 11, wherein the square beam has a size of approximately 0.2 mm×0.2 mm.

* * * * *